(12) United States Patent
Yoshikawa

(10) Patent No.: US 11,043,554 B2
(45) Date of Patent: Jun. 22, 2021

(54) SEMICONDUCTOR DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventor: Daiki Yoshikawa, Nonoichi (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 0 days.

(21) Appl. No.: 16/808,645

(22) Filed: Mar. 4, 2020

(65) Prior Publication Data

US 2021/0083044 A1    Mar. 18, 2021

(30) Foreign Application Priority Data

Sep. 18, 2019  (JP) .............................. JP2019-169390

(51) Int. Cl.
*H01L 29/06* (2006.01)
*H01L 29/40* (2006.01)
(Continued)

(52) U.S. Cl.
CPC ...... *H01L 29/0626* (2013.01); *H01L 29/0619* (2013.01); *H01L 29/16* (2013.01); *H01L 29/408* (2013.01); *H01L 29/861* (2013.01)

(58) Field of Classification Search
CPC ... H01L 29/0626; H01L 29/16; H01L 29/861; H01L 29/0619; H01L 29/408
(Continued)

(56) References Cited

U.S. PATENT DOCUMENTS 5,552,625 A     9/1996 Murakami et al.
2002/0063289 A1* 5/2002 Su ....................... H01L 27/0255
                                                    257/355
(Continued)

FOREIGN PATENT DOCUMENTS

JP          2850694 B2     1/1999
JP        2017-98440 A     6/2017
JP          6425611 B2    11/2018

*Primary Examiner* — Sheikh Maruf
(74) *Attorney, Agent, or Firm* — Oblon, McClelland, Maier & Neustadt, L.L.P.

(57) ABSTRACT

According to one embodiment, a semiconductor device includes first, second, and third electrodes, first, second, and third semiconductor regions, a plurality of ring-shaped regions, and a semi-insulating layer. The second semiconductor region is provided on the first semiconductor region. The third semiconductor region surrounds the second semiconductor region, and is provided on the first semiconductor region. The ring-shaped regions surround the second semiconductor region. The second electrode is provided on the second semiconductor region. The third electrode is provided on the third semiconductor region. The semi-insulating layer contacts the first semiconductor region, the second electrode, the ring-shaped regions, and the third electrode. The ring-shaped regions include first and second ring-shaped regions provided between the first ring-shaped region and the third semiconductor region. A length of the second ring-shaped region in a diametrical direction is shorter than a length of the first ring-shaped region in the diametrical direction.

18 Claims, 10 Drawing Sheets

(51) Int. Cl.
*H01L 29/861* (2006.01)
*H01L 29/16* (2006.01)

(58) Field of Classification Search
USPC ......... 257/355, 173, 565, 139, E23.001, 257/E29.014, E29.328
See application file for complete search history.

(56) References Cited

U.S. PATENT DOCUMENTS

| | | | |
|---|---|---|---|
| 2005/0205937 A1* | 9/2005 | Wang | H01L 27/0259 257/355 |
| 2006/0043489 A1* | 3/2006 | Chen | H01L 27/0255 257/355 |
| 2006/0237792 A1* | 10/2006 | Glenn | H01L 29/0626 257/355 |
| 2007/0020818 A1* | 1/2007 | Yu | H01L 27/0259 438/128 |
| 2007/0034897 A1* | 2/2007 | Kim | H01L 29/66121 257/173 |
| 2008/0029820 A1* | 2/2008 | Disney | H01L 29/735 257/355 |
| 2008/0315343 A1* | 12/2008 | Kitagawa | H01L 29/407 257/488 |
| 2009/0315113 A1* | 12/2009 | Vashchenko | H01L 29/7412 257/355 |
| 2010/0078724 A1* | 4/2010 | Imoto | H01L 27/0248 257/355 |
| 2011/0260246 A1* | 10/2011 | Disney | H01L 29/7811 257/337 |
| 2015/0303260 A1* | 10/2015 | Niedernostheide | H01L 23/3157 257/139 |
| 2017/0154955 A1 | 6/2017 | Harada et al. | |
| 2017/0263703 A1* | 9/2017 | Okumura | H01L 29/861 |

\* cited by examiner

SEMICONDUCTOR DEVICE

CROSS-REFERENCE TO RELATED APPLICATIONS

This application is based upon and claims the benefit of priority from Japanese Patent Application No. 2019-169390, filed on Sep. 18, 2019; the entire contents of which are incorporated herein by reference.

FIELD

Embodiments described herein relate generally to a semiconductor device.

BACKGROUND

A semiconductor device such as a diode, a Metal Oxide Silicon Field Effect Transistor (MOSFET), an Insulated Gate Bipolar Transistor (IGBT), or the like is used in applications such as power conversion, etc. There are cases where the breakdown voltage of the semiconductor device decreases as a voltage is applied. It is desirable for the decrease amount of the breakdown voltage due to the voltage application to be small.

DETAILED DESCRIPTION

Figure 1:
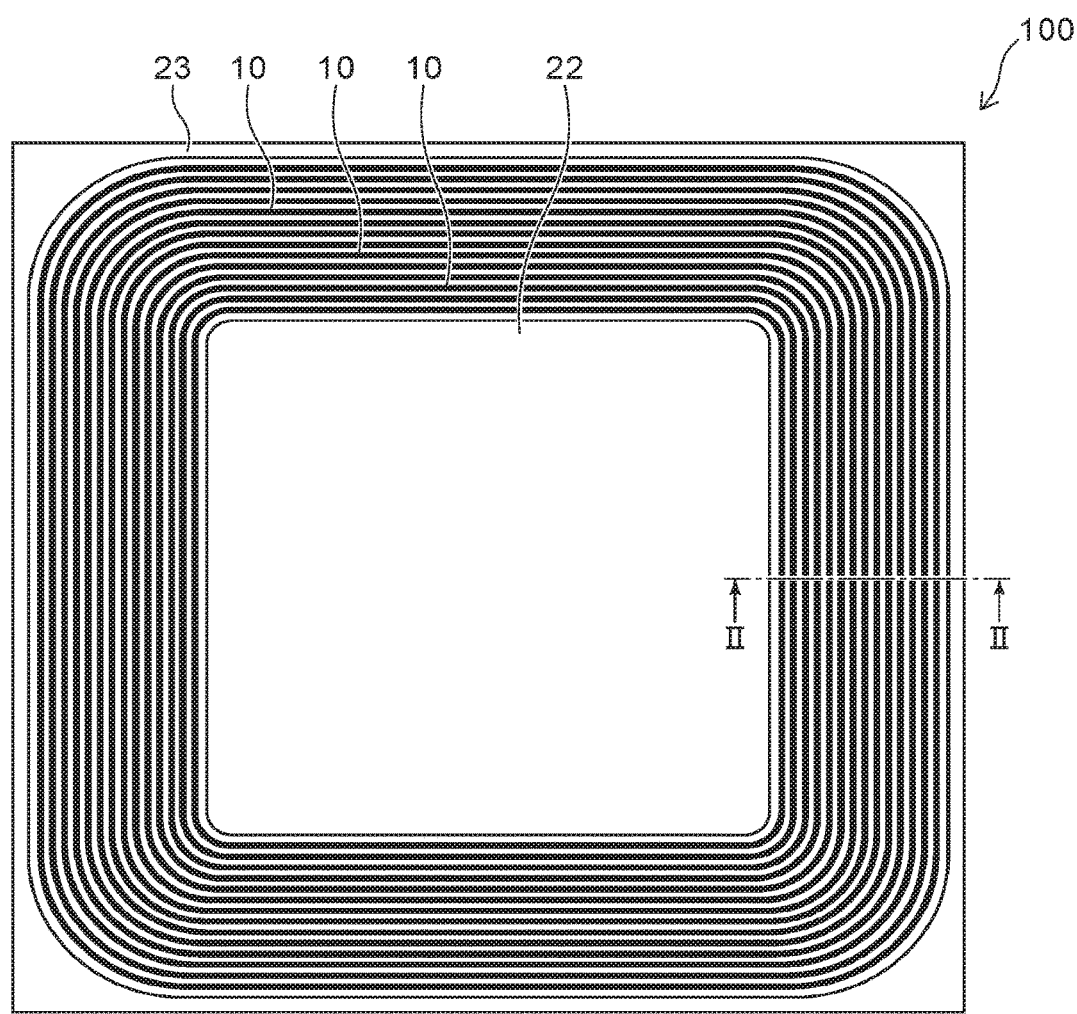
FIG. 1 is a plan view illustrating a semiconductor device according to a first embodiment.

According to one embodiment, a semiconductor device includes a first electrode, a first semiconductor region of a first conductivity type, a second semiconductor region of a second conductivity type, a third semiconductor region of the first conductivity type, a plurality of ring-shaped regions of the second conductivity type, a second electrode, a third electrode, and a semi-insulating layer. The first semiconductor region is provided on the first electrode and electrically connected to the first electrode. The second semiconductor region is provided on the first semiconductor region. The third semiconductor region surrounds the second semiconductor region. The third semiconductor region is provided on the first semiconductor region. An impurity concentration of the first conductivity type in the third semiconductor region is higher than an impurity concentration of the first conductivity type in the first semiconductor region. The ring-shaped regions surround the second semiconductor region. The ring-shaped regions are separated from the second semiconductor region and the third semiconductor region. The ring-shaped regions are provided to be separated from each other. The ring-shaped regions are positioned between the second semiconductor region and the third semiconductor region. The ring-shaped regions are of the second conductivity type. The second electrode is provided on the second semiconductor region and electrically connected to the second semiconductor region. The third electrode surrounds the second electrode. The third electrode is provided to be separated from the second electrode on the third semiconductor region, and is electrically connected to the third semiconductor region. The semi-insulating layer contacts the first semiconductor region, the second electrode, the plurality of ring-shaped regions, and the third electrode. The ring-shaped regions include a first ring-shaped region, and a second ring-shaped region provided between the first ring-shaped region and the third semiconductor region. A length of the second ring-shaped region in a diametrical direction is shorter than a length of the first ring-shaped region in the diametrical direction. The diametrical direction is from the second semiconductor region toward the third semiconductor region.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate. In the drawings and the description recited below, the notations of n+, n, n−, p+, and p indicate relative levels of the impurity concentrations. In other words, a notation marked with "+" indicates that the impurity concentration is relatively higher than that of a notation not marked with either "+" or "−;" and a notation marked with "−" indicates that the impurity concentration is relatively lower than that of a notation without any mark. In the case where both a p-type impurity and an n-type impurity are included in each region, these notations indicate relative levels of the net impurity concentrations after the impurities are compensated.

In the embodiments described below, each embodiment may be performed by inverting the p-type and the n-type of each semiconductor region.

First Embodiment

FIG. 1 is a plan view illustrating a semiconductor device according to a first embodiment.

Figure 2:
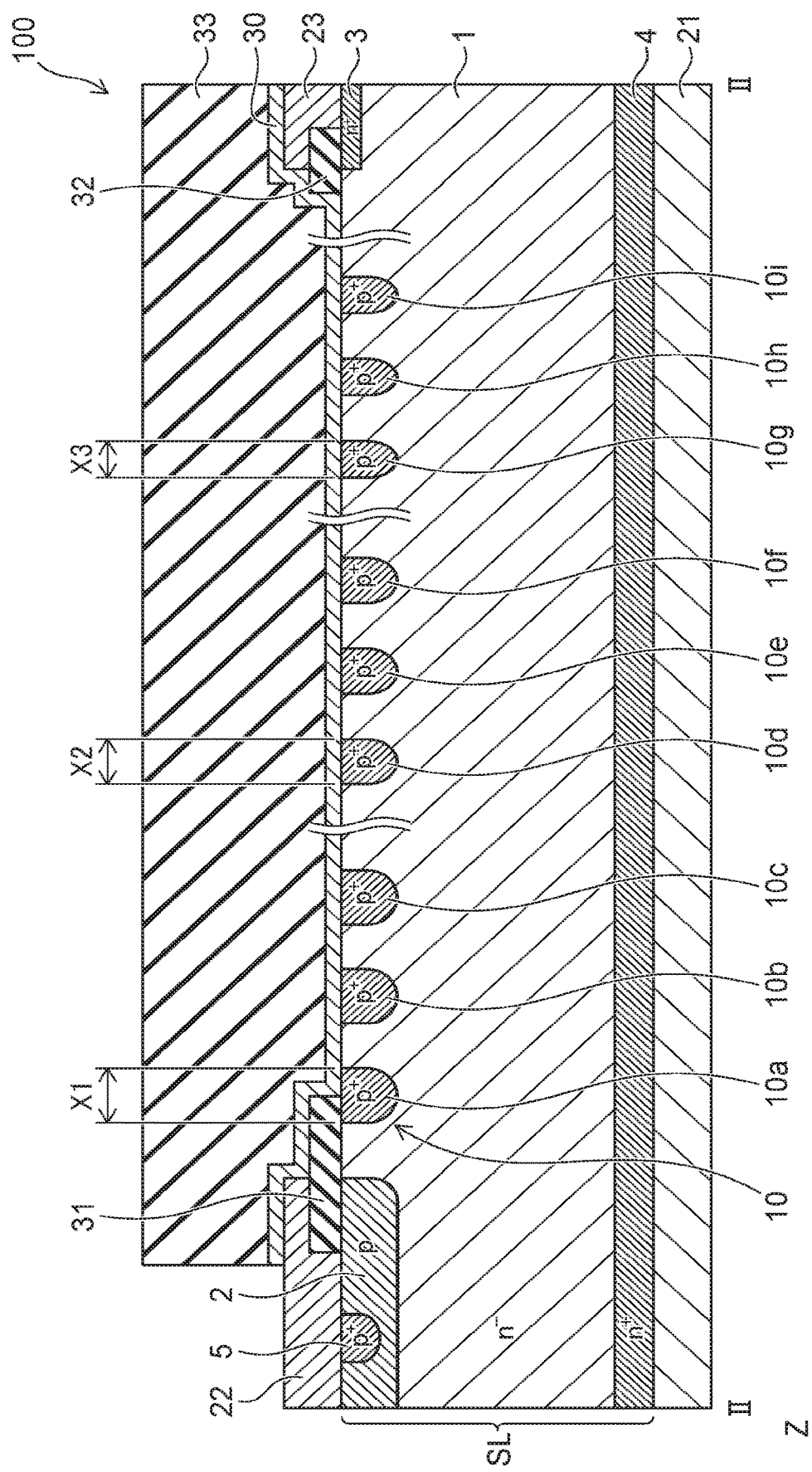
FIG. 2 is a II-II cross-sectional view of FIG. 1.

FIG. 2 is a II-II cross-sectional view of FIG. 1.

A semi-insulating layer 30, an insulating layer 31, an insulating layer 32, and an insulating portion 33 are not illustrated in FIG. 1.

The semiconductor device 100 according to the first embodiment is a diode. As illustrated in FIG. 1 and FIG. 2, the semiconductor device 100 includes a semiconductor layer SL, a lower electrode 21 (a first electrode), an upper electrode 22 (a second electrode), an EQuivalent-Potential Ring (EQPR) electrode 23 (a third electrode), the semi-insulating layer 30, the insulating layer 31, the insulating layer 32, and the insulating portion 33.

The semiconductor layer SL includes an n⁻-type (first conductivity type) semiconductor region 1 (a first semiconductor region), a p-type (second conductivity type) semiconductor region 2 (a second semiconductor region), an n⁺-type EQPR region 3 (a third semiconductor region), an n⁺-type contact region 4, a p⁺-type contact region 5, and a p⁺-type ring-shaped region 10.

An XYZ orthogonal coordinate system is used in the description of the embodiments. The direction from the lower electrode 21 toward the n⁻-type semiconductor region 1 is taken as a Z-direction. Two mutually-orthogonal directions perpendicular to the Z-direction are taken as an X-direction and a Y-direction. A direction from the center toward the outer perimeter of the semiconductor device 100 is taken as a diametrical direction. For the description, the direction from the lower electrode 21 toward the n⁻-type semiconductor region 1 is called "up;" and the reverse direction is called "down." These directions are based on the relative positional relationship between the lower electrode 21 and the n⁻-type semiconductor region 1 and are independent of the direction of gravity.

As illustrated in FIG. 2, the lower electrode 21 is provided at the lower surface of the semiconductor device 100. The n⁺-type contact region 4 is provided on the lower electrode 21 and electrically connected to the lower electrode 21. The n⁻-type semiconductor region 1 is provided on the n⁺-type contact region 4. The n⁻-type semiconductor region 1 is electrically connected to the lower electrode 21 via the n⁺-type contact region 4.

The p-type semiconductor region 2, the n⁺-type EQPR region 3, and the p⁺-type ring-shaped region 10 are provided on the n⁻-type semiconductor region 1. For example, the p-type semiconductor region 2 is provided at the central portion of the semiconductor device 100 in the X-direction and the Y-direction. The n⁺-type EQPR region 3 surrounds the p-type semiconductor region 2. For example, the n⁺-type EQPR region 3 is provided along the end portions in the X-direction and the end portions in the Y-direction of the semiconductor device 100.

As illustrated in FIG. 1 and FIG. 2, multiple p⁺-type ring-shaped regions 10 are provided between the p-type semiconductor region 2 and the n⁺-type EQPR region 3. The p⁺-type ring-shaped regions 10 each surround the p-type semiconductor region 2. The p-type semiconductor region 2, the n⁺-type EQPR region 3, and the multiple p⁺-type ring-shaped regions 10 are separated from each other in the diametrical direction. The number of the p⁺-type ring-shaped regions 10 is designed appropriately according to the desired breakdown voltage of the semiconductor device 100.

The n-type impurity concentration in the n⁺-type EQPR region 3 is higher than the n-type impurity concentration in the n⁻-type semiconductor region 1. For example, the p-type impurity concentrations in the p⁺-type ring-shaped regions 10 are higher than the p-type impurity concentration in the p-type semiconductor region 2.

As illustrated in FIG. 2, the p⁺-type contact region 5 is provided selectively on the p-type semiconductor region 2. The p-type impurity concentration in the p⁺-type contact region 5 is higher than the p-type impurity concentration in the p-type semiconductor region 2. The configuration, the number, the position, etc., of the p⁺-type contact region 5 are designed appropriately according to the desired characteristics of the semiconductor device 100.

The upper electrode 22 is provided on the p-type semiconductor region 2 and the p⁺-type contact region 5 and electrically connected to the p-type semiconductor region 2 and the p⁺-type contact region 5. The EQPR electrode 23 is provided on the n⁺-type EQPR region 3 and electrically connected to the n⁺-type EQPR region 3.

For example, as illustrated in FIG. 1, the upper electrode 22 is provided at the central portion of the semiconductor device 100 in the X-direction and the Y-direction. The EQPR electrode 23 is separated from the upper electrode 22 in the diametrical direction and surrounds the upper electrode 22. The EQPR electrode 23 is provided along the end portions in the X-direction and the end portions in the Y-direction of the semiconductor device 100.

As illustrated in FIG. 2, the insulating layer 31 is provided between the outer perimeter of the p-type semiconductor region 2 and the outer perimeter of the upper electrode 22. The insulating layer 32 is provided between the inner perimeter of the n⁺-type EQPR region 3 and the inner perimeter of the EQPR electrode 23.

The semi-insulating layer 30 contacts the EQPR electrode 23, the semiconductor layer SL (the n⁻-type semiconductor region 1 and the multiple p⁺-type ring-shaped regions 10), and the outer perimeter of the upper electrode 22. Therefore, the upper electrode 22, the semiconductor layer SL, and the EQPR electrode 23 are electrically connected via the semi-insulating layer 30.

The insulating portion 33 is provided on the semi-insulating layer 30. For example, the insulating portion 33 seals the outer perimeter of the upper surface of the semiconductor device 100. The central portion of the upper surface of the upper electrode 22 is not covered with the insulating portion 33 and is exposed externally.

The p⁺-type ring-shaped regions 10 will now be described in detail.

As illustrated in FIG. 2, many p⁺-type ring-shaped regions 10 are provided between the p-type semiconductor region 2 and the n⁺-type EQPR region 3. For example, the multiple p⁺-type ring-shaped regions 10 include p⁺-type ring-shaped regions 10a to 10i.

The p⁺-type ring-shaped regions 10a to 10c are next to each other in the diametrical direction. The p⁺-type ring-shaped regions 10d to 10f are provided between the p⁺-type ring-shaped region 10c and the n⁺-type EQPR region 3 and are next to each other in the diametrical direction. The p⁺-type ring-shaped regions 10d to 10f are separated from the p⁺-type ring-shaped regions 10a to 10c with other p⁺-type ring-shaped regions 10 interposed. The p⁺-type ring-shaped regions 10g to 10i are provided between the p⁺-type ring-shaped region 10f and the n⁺-type EQPR region 3 and are next to each other in the diametrical direction. The p⁺-type ring-shaped regions 10g to 10i are separated from the p⁺-type ring-shaped regions 10d to 10f with other p⁺-type ring-shaped regions 10 interposed. For example, one of the p⁺-type ring-shaped regions 10d to 10f is positioned at the middle of the multiple p⁺-type ring-shaped regions 10 arranged in the diametrical direction.

In the semiconductor device 100, a length X2 in the diametrical direction of the p⁺-type ring-shaped region 10d (an example of a second ring-shaped region) is shorter than a length X1 in the diametrical direction of the p⁺-type ring-shaped region 10a (an example of a first ring-shaped region). A length X3 in the diametrical direction of the p+-type ring-shaped region 10g (an example of a third ring-shaped region) is shorter than the length X2. In other words, the length in the diametrical direction of the p+-type ring-shaped region 10 is shorter than the length in the diametrical direction of another p+-type ring-shaped region 10 positioned further inward from the p+-type ring-shaped region 10.

The length of the p+-type ring-shaped region 10 is measured using the p-n junction surface between the n−-type semiconductor region 1 and the p+-type ring-shaped region 10 at the front surface of the semiconductor layer SL (the contact surface between the semiconductor layer SL and the semi-insulating layer 30). In other words, the length of the p+-type ring-shaped region 10 is represented by the length at the front surface of the semiconductor layer SL from one end of the p-n junction surface to the other end of the p-n junction surface in the diametrical direction. The distance between the p+-type ring-shaped regions 10 described below also is measured using the p-n junction surfaces between the n−-type semiconductor region 1 and each of the p+-type ring-shaped regions 10.

Operations of the semiconductor device 100 will now be described.

When a voltage that is positive with respect to the lower electrode 21 is applied to the upper electrode 22, a forward voltage is applied at the p-n junction surface between the n−-type semiconductor region 1 and the p-type semiconductor region 2. Thereby, the semiconductor device 100 is set to the ON-state; and a current flows from the upper electrode 22 toward the lower electrode 21.

Subsequently, when a voltage that is positive with respect to the upper electrode 22 is applied to the lower electrode 21, the flow of the current stops; and the semiconductor device 100 is switched from the ON-state to the OFF-state. A reverse voltage is applied at the p-n junction surface between the n−-type semiconductor region 1 and the p-type semiconductor region 2. Due to the application of the reverse voltage, a depletion layer spreads from the p-n junction surface between the n−-type semiconductor region 1 and the p-type semiconductor region 2.

When the depletion layer spreading from the p-type semiconductor region 2 reaches the p+-type ring-shaped regions 10, a reverse voltage is applied also between the n−-type semiconductor region 1 and the p+-type ring-shaped regions 10. Thereby, the depletion layer spreads also from the p-n junction surfaces between the n−-type semiconductor region 1 and the p+-type ring-shaped regions 10. Due to the spreading of the depletion layer from the p+-type ring-shaped regions 10, electric field concentration at the outer perimeter of the p-type semiconductor region 2 can be suppressed; and the breakdown voltage of the semiconductor device 100 can be increased.

When the semiconductor device 100 is in the OFF-state, the potential of the EQPR electrode 23 is substantially the same as the potential of the lower electrode 21. The upper electrode 22 and the EQPR electrode 23 are electrically connected to each other via the semi-insulating layer 30. Therefore, a micro current flows from the EQPR electrode 23 toward the upper electrode 22 via the semi-insulating layer 30. The potential of each portion of the semi-insulating layer 30 is fixed according to the flow of the current. The potential of each portion of the semi-insulating layer 30 affects the spreading of the depletion layer toward the outer perimeter of the semiconductor device 100. By fixing the potential of each portion of the semi-insulating layer 30, for example, the spreading of the depletion layer in the semiconductor device 100 can be stable; and the reliability of the semiconductor device 100 can be increased.

Also, when the semiconductor device 100 is in the OFF-state, an electric field is generated at the outer perimeter of the semiconductor device 100. Charged particles that exist in the insulating portion 33 and/or outside the semiconductor device 100 are attracted toward the semiconductor layer SL by the electric field. At this time, if the semi-insulating layer 30 is provided, the attracted charged particles flow through the semi-insulating layer 30 and are discharged to the upper electrode 22 or the EQPR electrode 23. Therefore, the fluctuation of the spreading of the depletion layer due to the external charged particles and the decrease of the breakdown voltage of the semiconductor device 100 can be suppressed.

If an insulating layer is provided between the semiconductor layer SL and the semi-insulating layer 30, there are cases where carriers that are accelerated inside the semiconductor layer SL are trapped inside the insulating layer. In the semiconductor device 100, an insulating layer is not provided between the semiconductor layer SL and the semi-insulating layer 30; and the semi-insulating layer 30 contacts the semiconductor layer SL. When the accelerated carriers penetrate the semi-insulating layer 30, the carriers are discharged to the upper electrode 22 or the EQPR electrode 23. Accordingly, the fluctuation of the spreading of the depletion layer and the decrease of the breakdown voltage of the semiconductor device 100 due to the trapping of the carriers inside the insulating layer can be suppressed.

Examples of the materials of the components of the semiconductor device 100 will now be described.

The n−-type semiconductor region 1, the p-type semiconductor region 2, the n+-type EQPR region 3, the n+-type contact region 4, the p+-type contact region 5, and the p+-type ring-shaped region 10 include silicon, silicon carbide, gallium nitride, or gallium arsenide as semiconductor materials. In the case where silicon is used as the semiconductor material, arsenic, phosphorus, or antimony can be used as an n-type impurity. Boron can be used as a p-type impurity.

The lower electrode 21, the upper electrode 22, and the EQPR electrode 23 include a metal such as aluminum, copper, etc.

The insulating layers 31 and 32 include an insulating material such as silicon oxide, silicon nitride, etc.

The semi-insulating layer 30 includes an insulating material such as silicon oxide, silicon nitride, etc. However, the electrical resistance of the semi-insulating layer 30 is lower than the electrical resistances of the insulating layers 31 and 32. For example, the resistivity of the semi-insulating layer 30 is not less than $1.0 \times 10^8$ (Ω·cm) but less than $1.0 \times 10^{13}$ (Ω·cm). The resistivities of the insulating layers 31 and 32 each are $1.0 \times 10^{13}$ (Ω·cm) or more.

The insulating portion 33 includes an insulating resin material such as polyimide, etc.

Effects of the first embodiment will now be described with reference to FIG. 3A to FIG. 4.

Figure 3A:
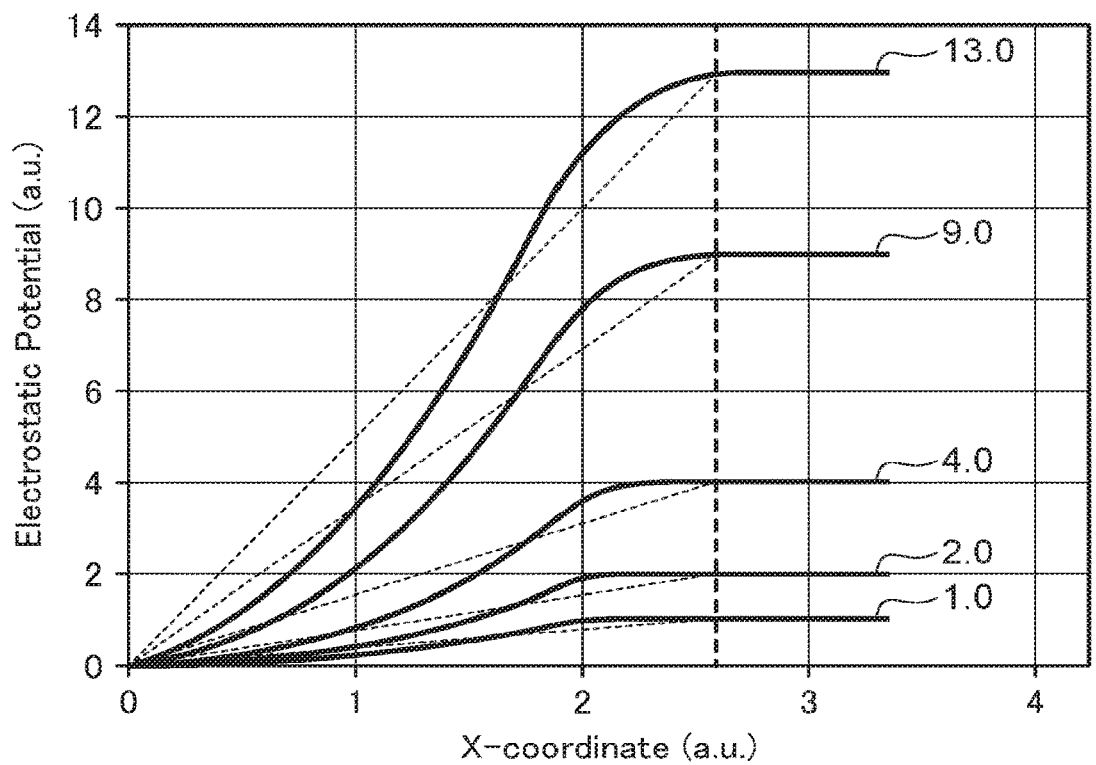
FIG. 3A and FIG. 3B are graphs illustrating characteristics of a semiconductor device according to a reference example and the semiconductor device according to the first embodiment.
Figure 3B:
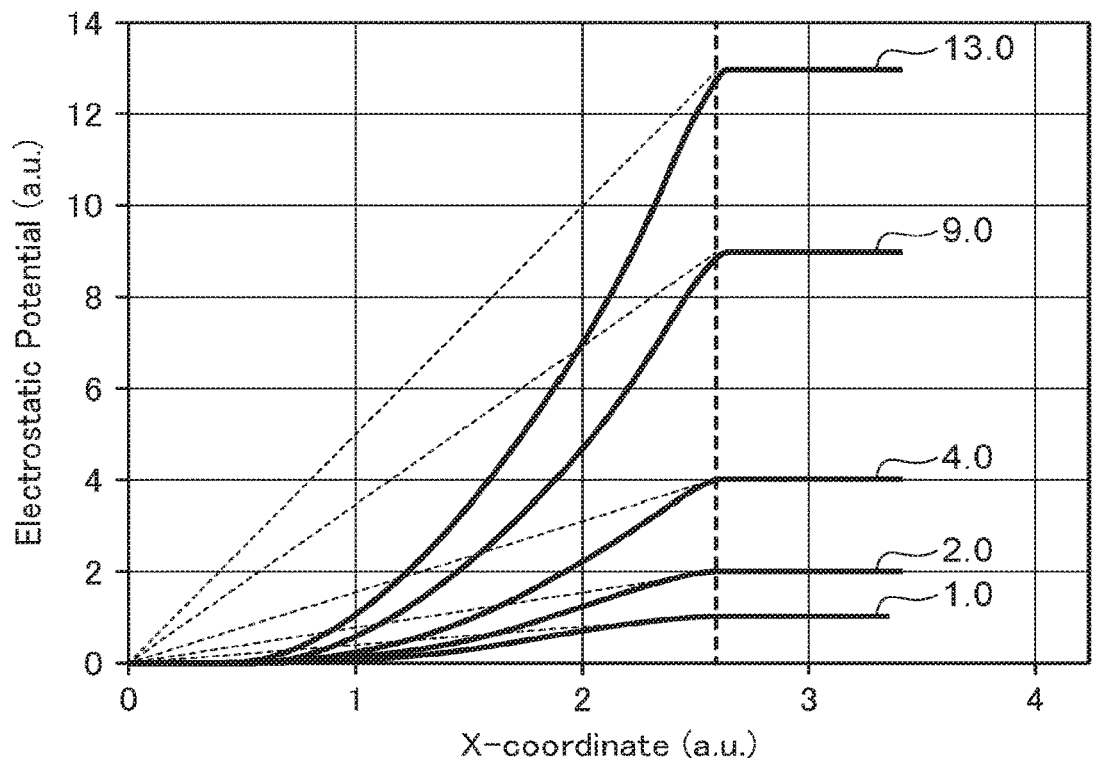

FIG. 3A is a graph illustrating characteristics of a semiconductor device according to a reference example. FIG. 3B is a graph illustrating characteristics of the semiconductor device according to the first embodiment.

Figure 4:
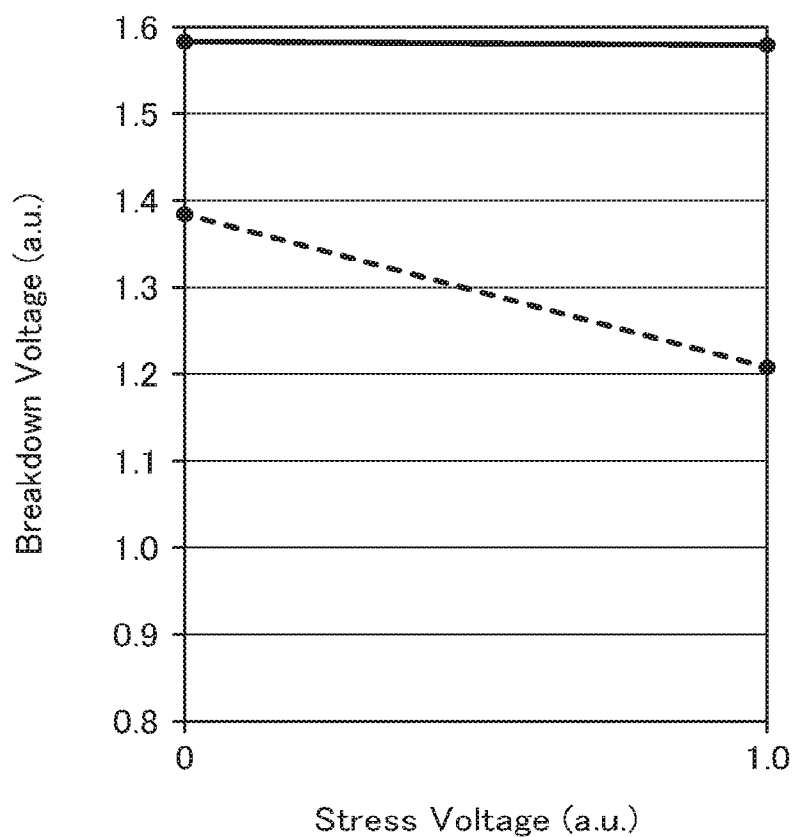
FIG. 4 is a graph illustrating characteristics of the semiconductor devices according to the reference example and the first embodiment.

FIG. 4 is a graph illustrating characteristics of the semiconductor devices according to the reference example and the first embodiment.

In the semiconductor device according to the reference example, the lengths in the diametrical direction of the multiple p+-type ring-shaped regions 10 are the same. Also, the distances between the p$^+$-type ring-shaped regions 10 next to each other in the diametrical direction are the same.

FIG. 3A and FIG. 3B illustrate the relationship between the position in the X-direction (the X-coordinate) and the potential at the center in the Y-direction respectively for the semiconductor devices. The horizontal axis is the X-coordinate when referenced to the position of the outer perimeter end portion of the upper electrode 22. The vertical axis is the potential when the semiconductor device is in the OFF-state. The values of the horizontal axis and the vertical axis have arbitrary units. The solid lines illustrate the potential of the front surface of the semiconductor layer SL. The dotted lines illustrate the potential of the semi-insulating layer 30. The inner perimeter end portion of the EQPR electrode 23 exists at the position where the value of the horizontal axis is about 2.6. FIG. 3A and FIG. 3B illustrate the characteristics when the lowest applied voltage is set to 1 and the applied voltage is increased to 13.

From FIG. 3A, in the semiconductor device according to the reference example, the potential of the semi-insulating layer 30 is higher than the potential of the front surface of the semiconductor layer SL in the range where the X-coordinate is 0 to about 1.5. On the other hand, the potential of the front surface of the semiconductor layer SL is higher than the potential of the semi-insulating layer 30 in the range where the X-coordinate is about 1.5 to 2.6.

In the semiconductor device according to the reference example, the spreading of the depletion layer at the p-type semiconductor region 2 vicinity is promoted to increase the breakdown voltage. Also, in the semiconductor device according to the reference example, to shorten the distance (the termination length) from the p-type semiconductor region 2 to the outer perimeter end portion of the semiconductor device 100, the spreading of the depletion layer at the outer perimeter end portion of the semiconductor device 100 is suppressed by providing the n$^+$-type EQPR region 3 and the EQPR electrode 23. As a result, at the outer perimeter side of the semiconductor device 100 as illustrated in FIG. 3A, the potential of the front surface of the semiconductor layer SL increases and becomes larger than the potential of the semi-insulating layer 30.

The inventor discovered the following for the semiconductor device according to the reference example.

When the semiconductor device is in the OFF-state and the potential of the semiconductor layer SL is higher than the potential of the semi-insulating layer 30, holes are injected from the semiconductor layer SL toward the semi-insulating layer 30 by the potential difference. At this time, if the holes are trapped by trap levels of the semi-insulating layer 30, the holes are not discharged to the upper electrode 22 and continue to collect in the semi-insulating layer 30. When the holes collect in the semi-insulating layer 30, the spreading of the depletion layer fluctuates due to the electric field formed by the holes; and the breakdown voltage of the semiconductor device 100 decreases.

Due to this problem, in the semiconductor device 100 according to the first embodiment, the lengths in the diametrical direction of the p$^+$-type ring-shaped regions 10 are set to be different. Specifically, the length in the diametrical direction of one of the p$^+$-type ring-shaped regions 10 is shorter than the length in the diametrical direction of another p$^+$-type ring-shaped region 10 positioned further inward from the one of the p$^+$-type ring-shaped regions 10. For example, by setting the pitches of the multiple p$^+$-type ring-shaped regions 10 to be constant, the proportion of the surface area of the n$^-$-type semiconductor region 1 to the front surface of the semiconductor layer SL increases as the lengths in the diametrical direction of the p$^+$-type ring-shaped regions 10 are reduced. The pitch corresponds to the distance between the center in the diametrical direction of one p$^+$-type ring-shaped region 10 and the center in the diametrical direction of another p$^+$-type ring-shaped region 10 next to the one p$^+$-type ring-shaped region 10.

The drop of the voltage at the front surface of the semiconductor layer SL increases as the proportion of the surface area of the n$^-$-type semiconductor region 1 increases. In other words, according to the semiconductor device 100 according to the first embodiment, by providing the p$^+$-type ring-shaped regions 10 having relatively short lengths in the diametrical direction, the voltage drop at the p$^+$-type ring-shaped region 10 vicinity is increased; and the potential at the p$^+$-type ring-shaped region 10 vicinity can be reduced. As a result, the intensity of the electric field from the semiconductor layer SL toward the semi-insulating layer 30 can be reduced. For example, it is possible to set the potential of the semi-insulating layer 30 to be higher than the potential of the front surface of the semiconductor layer SL.

FIG. 3B illustrates characteristics of the semiconductor device 100 when the lengths in the diametrical direction of the p$^+$-type ring-shaped regions 10 are shorter toward the outer perimeter. In the semiconductor device 100 as illustrated in FIG. 3B, compared to the semiconductor device according to the reference example, the potential of the semiconductor layer SL is low where the X-coordinate is 1.5 to 2.6. For the same termination length as that of the semiconductor device according to the reference example, the potential of the semiconductor layer SL is lower than the potential of the semi-insulating layer 30 at all X-coordinates. Thereby, an electric field is generated from the semi-insulating layer 30 toward the semiconductor layer SL; and the injection into the semi-insulating layer 30 of the holes flowing through the semiconductor layer SL can be suppressed. By suppressing the trapping of the holes inside the semi-insulating layer 30, the decrease of the breakdown voltage as the voltage is applied to the semiconductor device 100 can be suppressed.

FIG. 4 illustrates the fluctuation of the static breakdown voltage of the semiconductor device when a stress voltage is applied a sufficiently long time. In FIG. 4, the horizontal axis is the stress voltage. The vertical axis is the breakdown voltage of the semiconductor device. The horizontal axis and the vertical axis have arbitrary units. The solid line illustrates the characteristic of the semiconductor device 100 according to the first embodiment. The broken line illustrates the characteristic of the semiconductor device according to the reference example.

From FIG. 4, it can be seen that in the semiconductor device according to the reference example, the breakdown voltage after the stress voltage is applied decreases much more than the breakdown voltage before the stress voltage is applied. On the other hand, in the semiconductor device according to the first embodiment, the decrease of the breakdown voltage was small even when the stress voltage was applied. In other words, the decrease amount of the breakdown voltage when the stress voltage is applied in the semiconductor device according to the first embodiment is smaller than the decrease amount of the breakdown voltage when the stress voltage is applied in the semiconductor device according to the reference example. The difference of the decrease amount of the breakdown voltage is caused by the suppression of the injection of the holes from the semiconductor layer SL into the semi-insulating layer 30.

Thus, according to the first embodiment, the decrease of the breakdown voltage of the semiconductor device 100 as the voltage is applied can be suppressed while maintaining the termination length.

For the multiple $p^+$-type ring-shaped regions 10, it is sufficient for the length in the diametrical direction of at least a portion of the $p^+$-type ring-shaped regions 10 to be shorter than the length in the diametrical direction of a $p^+$-type ring-shaped region 10 positioned further inward from the at least a portion of the $p^+$-type ring-shaped regions 10. Thereby, at the vicinity of the at least a portion of the $p^+$-type ring-shaped regions 10, the potential decreases; and the injection of the holes from the semiconductor layer SL into the semi-insulating layer 30 can be suppressed.

To reduce the potential at the vicinities of more of the $p^+$-type ring-shaped regions 10, it is favorable for the lengths in the diametrical direction of the $p^+$-type ring-shaped regions 10 to be shorter toward the outer perimeter. The injection of the holes from the semiconductor layer SL into the semi-insulating layer 30 can be suppressed further thereby. In such a case, the lengths of a portion of the $p^+$-type ring-shaped regions 10 next to each other may be the same. For example, the length in the diametrical direction of the $p^+$-type ring-shaped region 10i may be shorter than the length in the diametrical direction of the $p^+$-type ring-shaped region 10h or may be the same as the length in the diametrical direction of the $p^+$-type ring-shaped region 10h. It is sufficient for the macroscopic tendency to be such that the lengths in the diametrical direction of the $p^+$-type ring-shaped regions 10 are shorter toward the outer perimeter. Thereby, the injection of the holes from the semiconductor layer SL into the semi-insulating layer 30 can be greatly suppressed; and the decrease of the breakdown voltage of the semiconductor device 100 as the voltage is applied can be suppressed further.

First Modification

Figure 5:
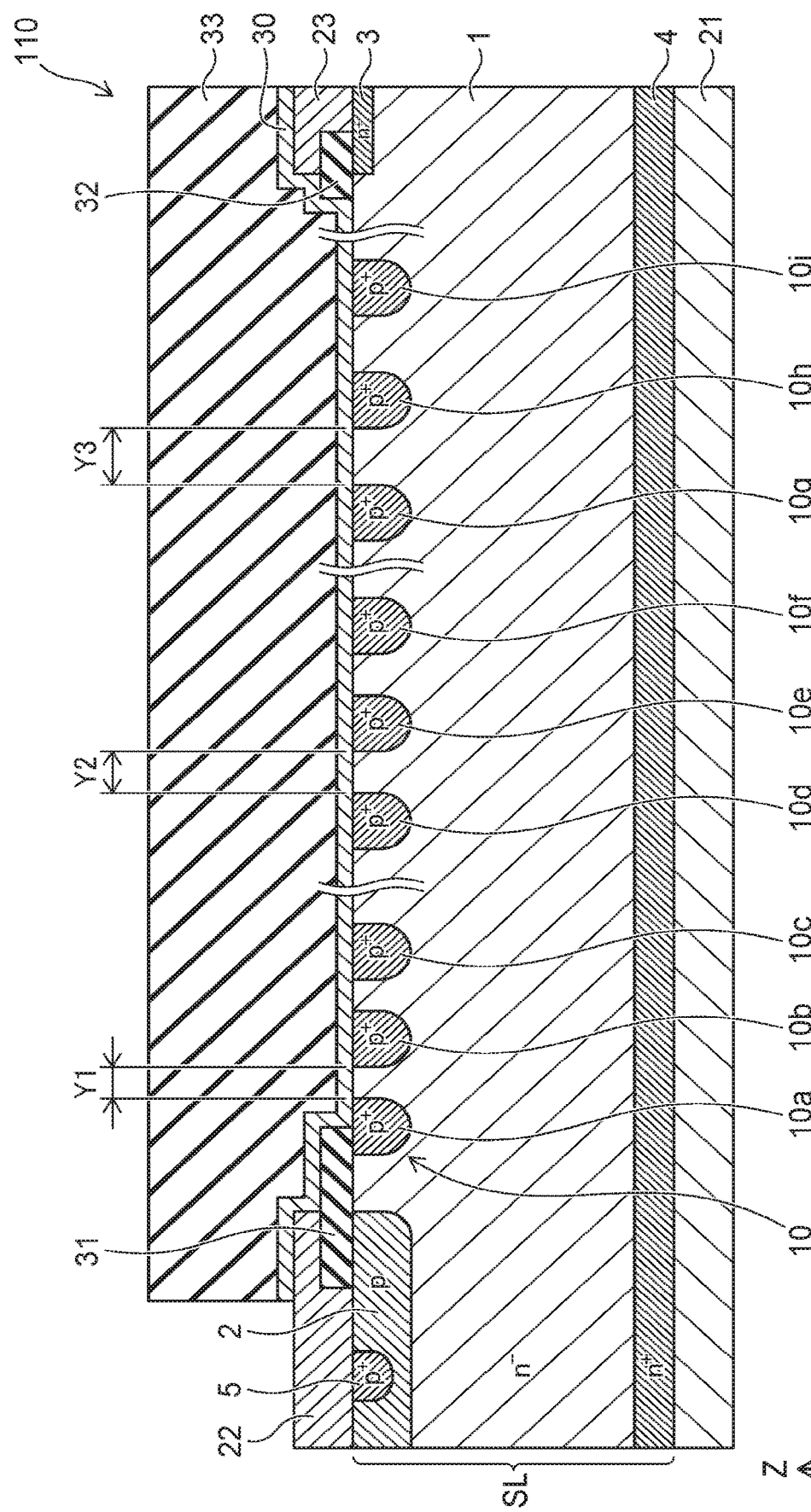
FIG. 5 is a cross-sectional view illustrating a portion of a semiconductor device according to a first modification of the first embodiment.

FIG. 5 is a cross-sectional view illustrating a portion of a semiconductor device according to a first modification of the first embodiment.

In the semiconductor device 110 according to the first modification, a distance Y2 in the diametrical direction between the $p^+$-type ring-shaped region 10d (an example of the third ring-shaped region) and the $p^+$-type ring-shaped region 10e (an example of a fourth ring-shaped region) is longer than a distance Y1 in the diametrical direction between the $p^+$-type ring-shaped region 10a (an example of the first ring-shaped region) and the $p^+$-type ring-shaped region 10b (an example of the second ring-shaped region). A distance Y3 in the diametrical direction between the $p^+$-type ring-shaped region 10g (an example of a fifth ring-shaped region) and the $p^+$-type ring-shaped region 10h (an example of a sixth ring-shaped region) is longer than the distance Y2. In other words, the distance between the $p^+$-type ring-shaped regions 10 is longer than the distance between other $p^+$-type ring-shaped regions 10 positioned further inward from the $p^+$-type ring-shaped regions 10.

Setting the distance between the $p^+$-type ring-shaped regions 10 to be longer causes the voltage drop in the $n^-$-type semiconductor region 1 between the $p^+$-type ring-shaped regions 10 to increase; and the potential decreases. Therefore, the intensity of the electric field from the semi-insulating layer 30 toward the semiconductor layer SL can be reduced. For example, an electric field from the semiconductor layer SL toward the semi-insulating layer 30 can be formed. Accordingly, according to the semiconductor device 110, similarly to the semiconductor device 100, the injection of the holes from the semiconductor layer SL into the semi-insulating layer 30 can be suppressed; and the decrease of the breakdown voltage can be suppressed.

The distance between a pair of the $p^+$-type ring-shaped regions 10 next to each other may be the same as the distance between another pair of the $p^+$-type ring-shaped regions 10 next to the pair. For example, the distance between the $p^+$-type ring-shaped regions 10h and 10i may be the same as or longer than the distance between the $p^+$-type ring-shaped regions 10g and 10h. It is sufficient for the macroscopic tendency to be such that the distances in the diametrical direction between the $p^+$-type ring-shaped regions 10 next to each other are longer toward the outer perimeter. Thereby, the injection of the holes from the semiconductor layer SL into the semi-insulating layer 30 can be greatly suppressed; and the decrease of the breakdown voltage of the semiconductor device 110 as the voltage is applied can be suppressed further.

Second Modification

Figure 6:
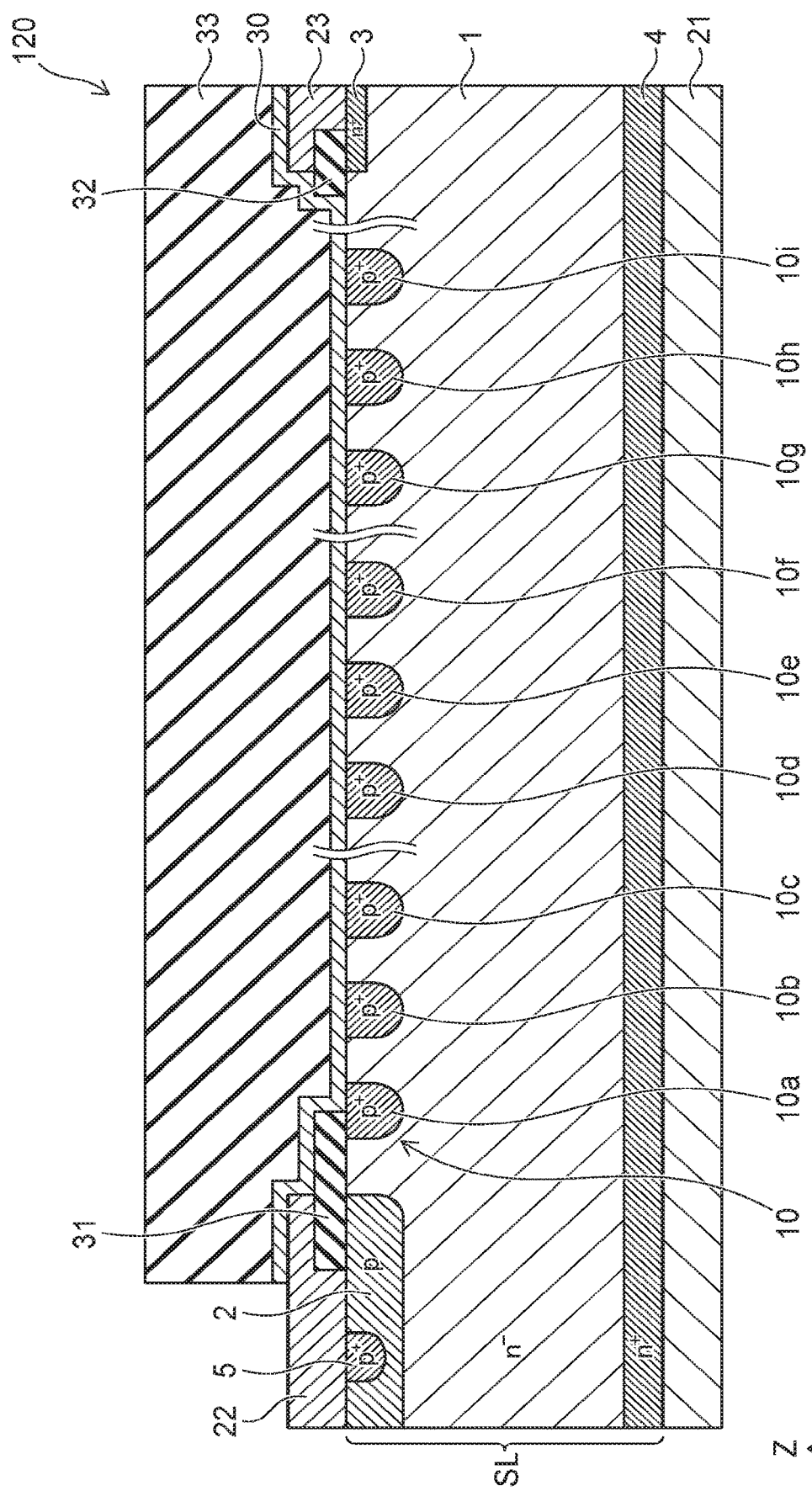
FIG. 6 is a cross-sectional view illustrating a portion of a semiconductor device according to a second modification of the first embodiment.

FIG. 6 is a cross-sectional view illustrating a portion of a semiconductor device according to a second modification of the first embodiment.

In the semiconductor device 120 according to the second modification, the p-type impurity concentration in the $p^+$-type ring-shaped region 10d (an example of the second ring-shaped region) is lower than the p-type impurity concentration in the $p^+$-type ring-shaped region 10a (an example of the first ring-shaped region). The p-type impurity concentration in the $p^+$-type ring-shaped region 10g (an example of the third ring-shaped region) is lower than the p-type impurity concentration in the $p^+$-type ring-shaped region 10d. In other words, the p-type impurity concentration in the $p^+$-type ring-shaped region 10 is lower than the p-type impurity concentration in another $p^+$-type ring-shaped region 10 positioned further inward from the $p^+$-type ring-shaped region 10.

The electrical resistance of the $p^+$-type ring-shaped region 10 increases as the p-type impurity concentration in the $p^+$-type ring-shaped region 10 decreases. Thereby, the voltage drop in the $p^+$-type ring-shaped region 10 increases; and the potential at the $p^+$-type ring-shaped region 10 vicinity decreases. Therefore, the intensity of the electric field from the semi-insulating layer 30 toward the semiconductor layer SL can be reduced. For example, an electric field from the semiconductor layer SL toward the semi-insulating layer 30 can be formed. Accordingly, according to the semiconductor device 120, similarly to the semiconductor device 100, the injection of the holes from the semiconductor layer SL into the semi-insulating layer 30 can be suppressed; and the decrease of the breakdown voltage of the semiconductor device 120 can be suppressed.

The p-type impurity concentrations in a portion of the $p^+$-type ring-shaped regions 10 next to each other may be the same. For example, the p-type impurity concentration in the $p^+$-type ring-shaped region 10i may be the same as or lower than the p-type impurity concentration in the $p^+$-type ring-shaped region 10h. It is sufficient for the macroscopic tendency to be such that the p-type impurity concentrations in the $p^+$-type ring-shaped regions 10 are lower toward the outer perimeter. Thereby, the injection of the holes from the semiconductor layer SL into the semi-insulating layer 30 can be greatly suppressed; and the decrease of the breakdown voltage of the semiconductor device 120 as the voltage is applied can be suppressed further.

It is also possible to combine the structures of the semiconductor devices 100 to 120 described above. For example, in the semiconductor device 100, the distance between the p+-type ring-shaped regions 10 may be longer than the distance between other p+-type ring-shaped regions 10 positioned further inward from the p+-type ring-shaped regions 10. In the semiconductor device 100, the p-type impurity concentration in the p+-type ring-shaped region 10 may be lower than the p-type impurity concentration in another p+-type ring-shaped region 10 positioned further inward from the p+-type ring-shaped region 10.

Third Modification

Figure 7:
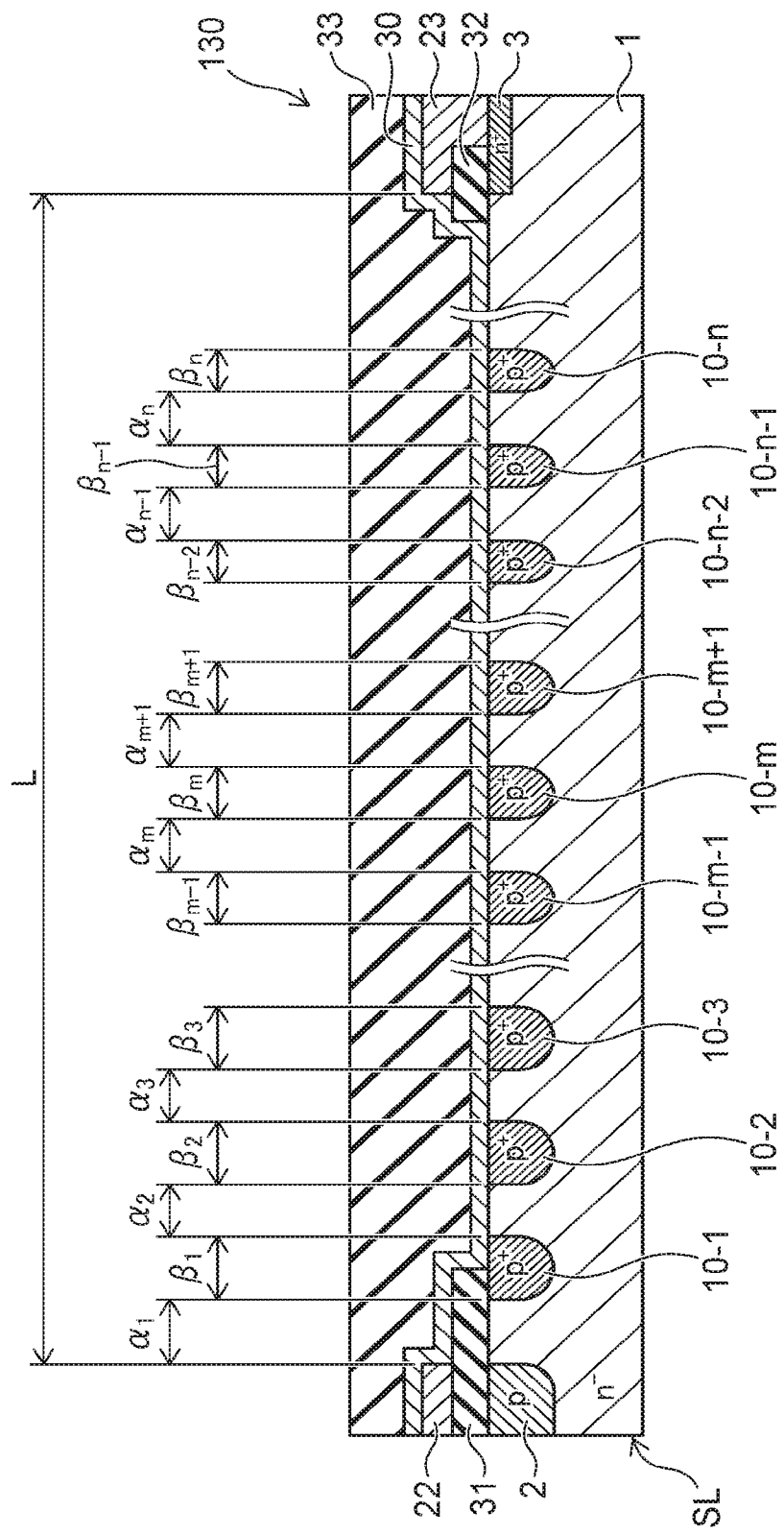
FIG. 7 is a cross-sectional view for describing a semiconductor device according to a third modification of the first embodiment.
Figure 8:
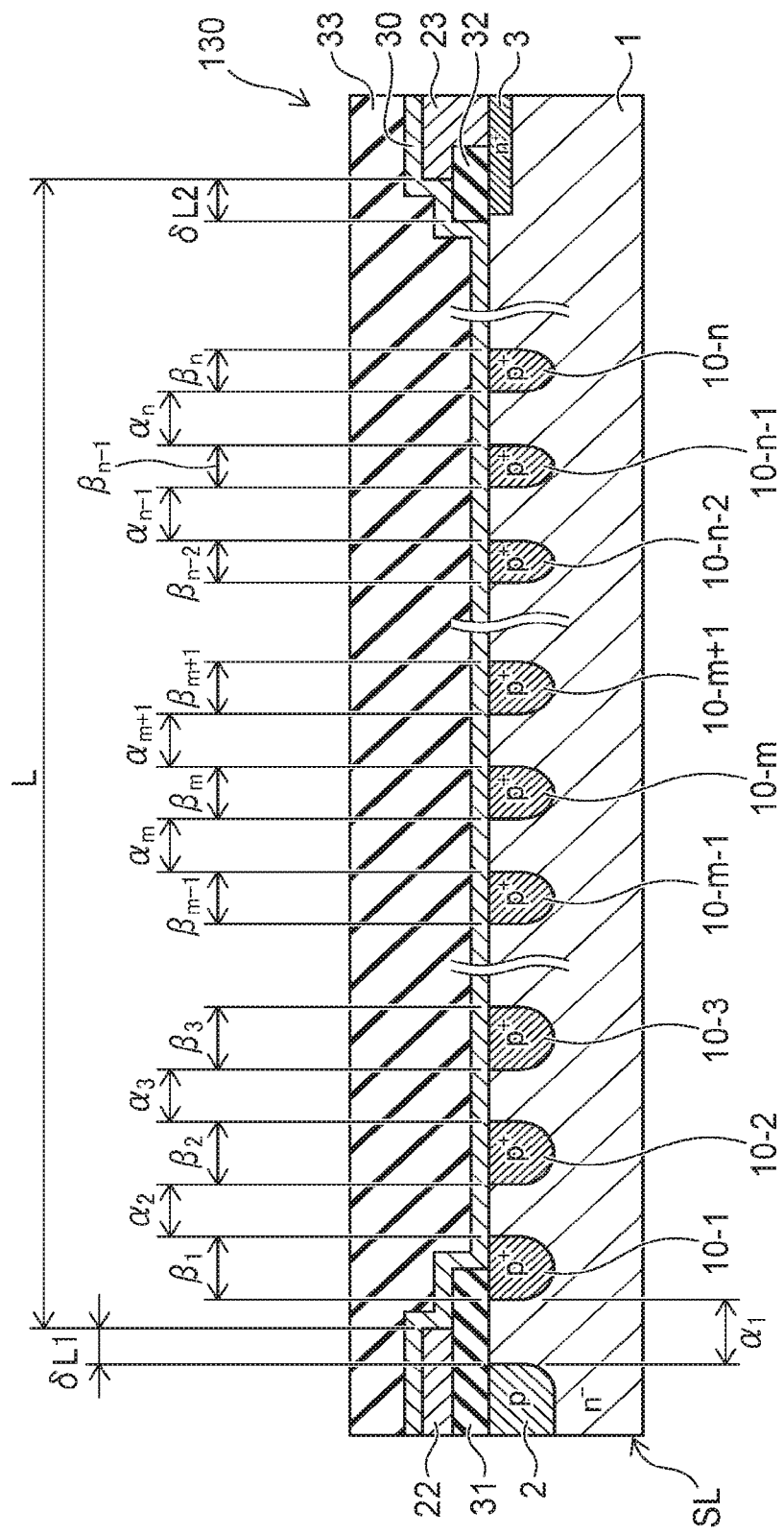
FIG. 8 is a cross-sectional view for describing a semiconductor device according to a third modification of the first embodiment.

FIG. 7 and FIG. 8 are cross-sectional views for describing a semiconductor device according to a third modification of the first embodiment.

In the semiconductor device 130 according to the third modification, at least one of the lengths in the diametrical direction of the p+-type ring-shaped regions 10 or the distances between the p+-type ring-shaped regions 10 are designed to satisfy Formula 1 to Formula 3 recited below.

$$\alpha_1 < \frac{2\varepsilon V}{LqN_d} \quad \text{[Formula 1]}$$

$$\alpha_i^2 < \frac{2\varepsilon V}{LqN_d}(\alpha_i + \beta_{i-1}) \quad \text{[Formula 2]}$$

$$\sum_i \alpha_i^2 < \sum_i \frac{2\varepsilon V}{LqN_d}(\alpha_i + \beta_{i-1}) \quad \text{[Formula 3]}$$

In the semiconductor device 130 illustrated in FIG. 7, n p+-type ring-shaped regions 10 (p+-type ring-shaped regions 10-1 to 10-n) are arranged from the p-type semiconductor region 2 toward the n+-type EQPR region 3. In Formula 1 to Formula 3, $\alpha_i$ is the distance (μm) in the diametrical direction between the ith p+-type ring-shaped region 10 and the (i−1)th p+-type ring-shaped region 10 counting from the inner perimeter side. i is not less than 1 and not more than n. $\alpha_i$ is the distance (μm) in the diametrical direction between the p-type semiconductor region 2 and the first p+-type ring-shaped region 10 when i is 1. $\beta_i$ is the length (μm) in the diametrical direction of the ith p+-type ring-shaped region 10. q is the elementary charge (C). ε is the dielectric constant (F/cm) of the n−-type semiconductor region 1. $N_d$ is the n-type carrier density (cm−2) in the n−-type semiconductor region 1. L is the distance (μm) between the upper electrode 22 and the EQPR electrode 23 in the diametrical direction. V is the static breakdown voltage (V) of the semiconductor device 130.

Formula 1 to Formula 3 are derived using Gauss's law. When Formula 1 and Formula 2 are satisfied, the potential of the ith p+-type ring-shaped region 10 is lower than the potential of the semi-insulating layer 30 directly above the ith p+-type ring-shaped region 10. Also, when Formula 3 is satisfied, the potential of any p+-type ring-shaped region 10 is lower than the potential of the semi-insulating layer 30 directly above that p+-type ring-shaped region 10. Accordingly, at any point, an electric field is generated from the semi-insulating layer 30 toward the semiconductor layer SL; and the injection of the holes from the semiconductor layer SL into the semi-insulating layer 30 is suppressed effectively.

As an example, the elementary charge q is 1.6×10−19 (C). The dielectric constant 8 is 1.04×10−12 (F/cm). The n-type carrier density $N_d$ is 6×10$^{12}$ (cm−1). The distance L is 2000 (μm). The static breakdown voltage V is 6000 (V). In such a case, $2\varepsilon/LqN_d$ in Formulas 1 to 3 is about 6.5 (μm). From this result, Formula 2 is represented by $\alpha_i^2 < 6.5 \times (\alpha_i + \beta_{i-1})$. For example, when $\alpha_i + \beta_{i-1}$ is 25 (μm), $\alpha_i$ is designed to be 13 (μm) or less to satisfy Formula 2.

In the semiconductor device 130, the width of the depletion layer at the p+-type ring-shaped region 10 widens when the ratio of the p-type impurity concentration in the p+-type ring-shaped region 10 to the n-type impurity concentration in the n−-type semiconductor region 1 is insufficiently large. The potential of the semiconductor layer SL is affected when the width of the depletion layer at the p+-type ring-shaped region 10 widens. Although the injection of the holes from the semiconductor layer SL into the semi-insulating layer 30 can be suppressed by designing the p+-type ring-shaped regions 10 based on Formulas 1 to 3, it is more favorable to use Formulas 4 and 5 instead of Formulas 1 and 3. At least one of the lengths in the diametrical direction of the p+-type ring-shaped regions 10 or the distances between the p+-type ring-shaped regions 10 are designed to satisfy Formulas 2, 4, and 5.

$$(\alpha_i^2 + 2x\alpha_i\beta_{i-1} + O(x^2)) \simeq \alpha_i^2 + 2x\alpha_i\beta_{i-1} < \frac{2\varepsilon V}{LqN_d}(\alpha_i + \beta_{i-1}), \quad \text{[Formula 4]}$$

$$\sum_i (\alpha_i^2 + 2x\alpha_i\beta_{i-1}) < \sum_i \frac{2\varepsilon V}{LqN_d}(\alpha_i + \beta_{i-1}) \quad \text{[Formula 5]}$$

In Formulas 4 and 5, x represents the proportion of the depletion of the p+-type ring-shaped region 10 and is greater than 0 and not more than 1. $O(x^2)$ represents the second and higher order terms of x. For example, x is sufficiently less than 1 when the n-type carrier density in the n−-type semiconductor region 1 is 1.0×10$^{13}$ (cm−2) or less and the p-type carrier density in the p+-type ring-shaped region 10 is 1.0×10$^{17}$ (cm−2) or more. Therefore, the depletion of the p+-type ring-shaped region 10 can be ignored. When the p-type carrier density in the p+-type ring-shaped region 10 is 1.0×10$^{16}$ (cm−2) or less, it is favorable to use Formulas 4 and 5 because the potential of the semiconductor layer SL is greatly affected by the depletion of the p+-type ring-shaped region 10.

Formula 3 is used favorably in the case where the position in the diametrical direction of the outer perimeter end portion of the p-type semiconductor region 2 is the same as the position in the diametrical direction of the outer perimeter end portion of the upper electrode 22, and the position in the diametrical direction of the inner perimeter end portion of the n+-type EQPR region 3 is the same as the position in the diametrical direction of the inner perimeter end portion of the EQPR electrode 23. Formula 3 may be modified in the case where the position in the diametrical direction of the outer perimeter end portion of the p-type semiconductor region 2 is different from the position in the diametrical direction of the outer perimeter end portion of the upper electrode 22 or in the case where the position in the diametrical direction of the inner perimeter end portion of the n+-type EQPR region 3 is different from the position in the diametrical direction of the inner perimeter end portion of the EQPR electrode 23. Although the injection of the holes from the semiconductor layer SL into the semi-insulating layer 30 can be suppressed by designing the p+-type ring-shaped regions 10 based on Formulas 1 to 3, it is more favorable to use Formula 6 instead of Formula 3.

$$\sum_{i}^{n} \alpha_i^2 < \sum_{i}^{n} \frac{2\varepsilon V}{LqN_d}(\alpha_i + \beta_{i-1}) - \delta L_1 + \delta L_2 \quad \text{[Formula 6]}$$

As illustrated in FIG. 8, $\delta L_1$ is the distance in the diametrical direction between the outer perimeter end portion of the p-type semiconductor region 2 and the outer perimeter end portion of the upper electrode 22. $\delta L_2$ is the distance in the diametrical direction between the inner perimeter end portion of the $n^+$-type EQPR region 3 and the inner perimeter end portion of the EQPR electrode 23. $\alpha L_1$ has a positive value when the outer perimeter end portion of the upper electrode 22 is positioned further toward the outer perimeter side of the semiconductor device 130 than is the outer perimeter end portion of the p-type semiconductor region 2. $\delta L_1$ has a negative value when the outer perimeter end portion of the upper electrode 22 is positioned further toward the inner perimeter side of the semiconductor device 130 than is the outer perimeter end portion of the p-type semiconductor region 2. $\delta L_2$ has a positive value when the inner perimeter end portion of the EQPR electrode 23 is positioned further toward the outer perimeter side of the semiconductor device 130 than is the inner perimeter end portion of the $n^+$-type EQPR region 3. $\delta L_2$ has a negative value when the inner perimeter end portion of the EQPR electrode 23 is positioned further toward the inner perimeter side of the semiconductor device 130 than is the inner perimeter end portion of the $n^+$-type EQPR region 3. At least one of the lengths in the diametrical direction of the $p^+$-type ring-shaped regions 10 or the distances between the $p^+$-type ring-shaped regions 10 is designed to satisfy Formulas 1, 2, and 6.

Second Embodiment

Figure 9:
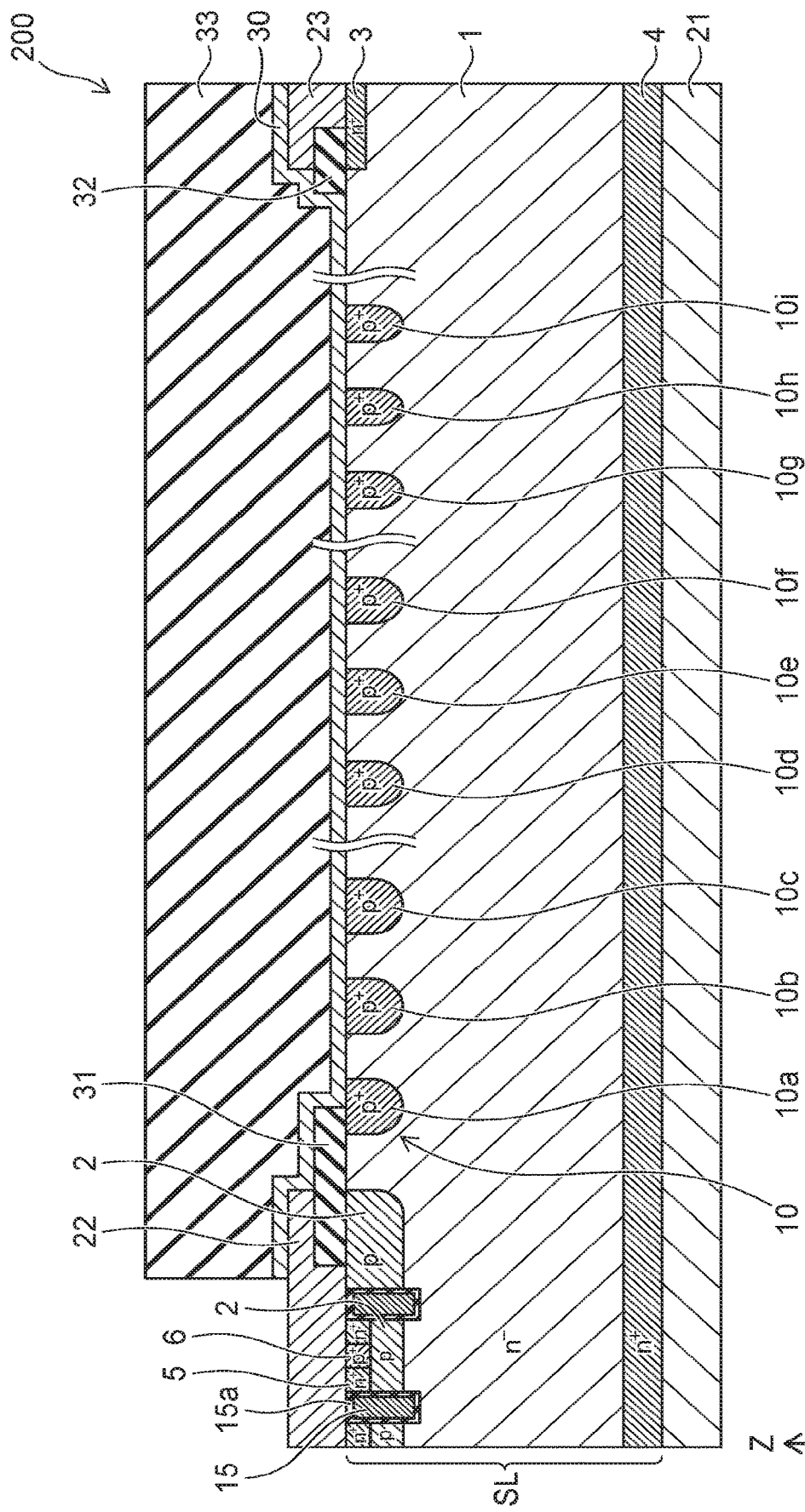
FIG. 9 is a cross-sectional view illustrating a portion of a semiconductor device according to a second embodiment.

FIG. 9 is a cross-sectional view illustrating a portion of a semiconductor device according to a second embodiment.

The semiconductor device 200 according to the second embodiment is a MOSFET. As illustrated in FIG. 9, compared to the semiconductor device 100, the semiconductor device 200 further includes an $n^+$-type source region 6 (a fourth semiconductor region) and a gate electrode 15.

The $p^+$-type contact region 5 and the $n^{-1}$-type source region 6 are provided selectively on the p-type semiconductor region 2. The gate electrode 15 opposes the p-type semiconductor region 2 with a gate insulating layer 15a interposed. In the example illustrated in FIG. 9, the gate electrode 15 also opposes the $n^+$-type source region 6 and a portion of the $n^-$-type semiconductor region 1. For example, pluralities in the X-direction are provided for the p-type semiconductor region 2, the $p^+$-type contact region 5, the $n^+$-type source region 6, and the gate electrode 15; and these components extend in the Y-direction.

Operations of the semiconductor device 200 will now be described.

A voltage that is not less than a threshold is applied to the gate electrode 15 in a state in which a voltage that is positive with respect to the upper electrode 22 is applied to the lower electrode 21. Thereby, a channel (an inversion layer) is formed in the p-type semiconductor region 2; and the semiconductor device 200 is set to the ON-state. Electrons flow from the upper electrode 22 toward the lower electrode 21 via the channel. Subsequently, when the voltage applied to the gate electrode 15 becomes lower than the threshold, the channel in the p-type semiconductor region 2 disappears; and the semiconductor device 200 is set to the OFF-state.

The functions of the $p^+$-type ring-shaped region 10 and the semi-insulating layer 30 when the semiconductor device 200 is in the OFF-state are similar to those of the semiconductor device 100. In other words, the spreading of the depletion layer from the p-type semiconductor region 2 toward the outer perimeter of the semiconductor device 200 is promoted by providing the $p^+$-type ring-shaped regions 10. The breakdown voltage of the semiconductor device 200 is increased thereby. Also, by providing the semi-insulating layer 30 so that the semi-insulating layer 30 contacts the semiconductor layer SL, the decrease of the breakdown voltage of the semiconductor device 200 can be suppressed.

In the semiconductor device 200 as well, similarly to the first embodiment, the length in the diametrical direction of the $p^+$-type ring-shaped region 10 is shorter than the length in the diametrical direction of another $p^+$-type ring-shaped region 10 positioned further inward from the $p^+$-type ring-shaped region 10. Or, the distance between the $p^+$-type ring-shaped regions 10 is longer than the distance between other $p^+$-type ring-shaped regions 10 positioned further inward from the $p^+$-type ring-shaped regions 10. Or, the p-type impurity concentration in the $p^+$-type ring-shaped region 10 is lower than the p-type impurity concentration in another $p^+$-type ring-shaped region 10 positioned further inward from the $p^+$-type ring-shaped region 10. By satisfying at least one of these conditions, the injection of the holes into the semi-insulating layer 30 can be suppressed; and the decrease of the breakdown voltage as the voltage is applied to the semiconductor device 200 can be suppressed. In the semiconductor device 200, similarly to the third modification of the first embodiment, at least one of the lengths in the diametrical direction of the $p^+$-type ring-shaped regions 10 or the distances between the $p^+$-type ring-shaped regions 10 may be designed to satisfy the formulas described above.

Third Embodiment

Figure 10:
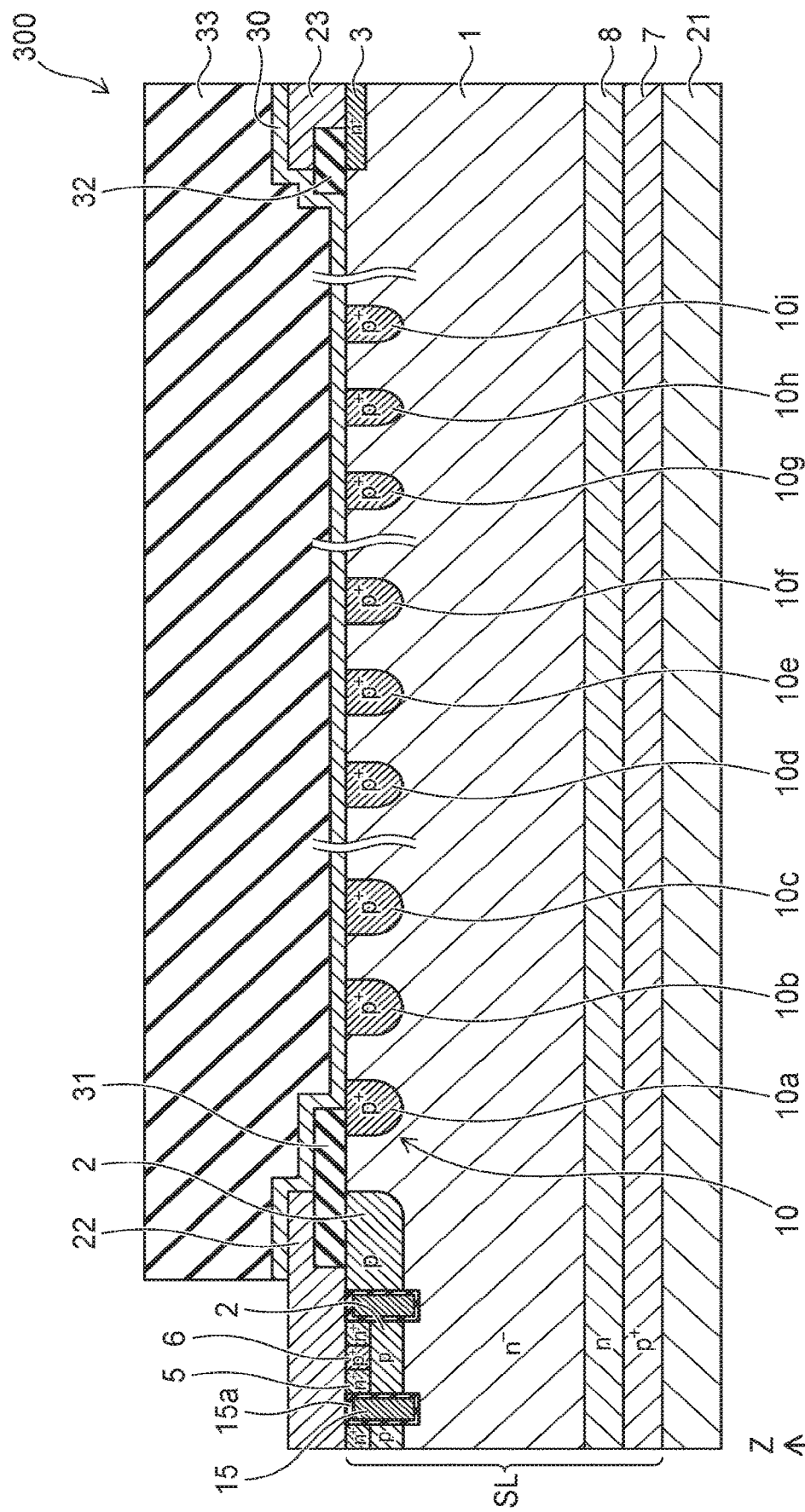
FIG. 10 is a cross-sectional view illustrating a portion of a semiconductor device according to a third embodiment.

FIG. 10 is a cross-sectional view illustrating a portion of a semiconductor device according to a third embodiment.

The semiconductor device 300 is an IGBT. The semiconductor device 300 differs from the semiconductor device 200 in that the semiconductor device 300 includes a $p^+$-type collector region 7 (a fifth semiconductor region) and an n-type buffer region 8 instead of the $n^+$-type contact region 4. The $p^+$-type collector region 7 is provided between the lower electrode 21 and the $n^-$-type semiconductor region 1. The n-type buffer region 8 is provided between the $p^+$-type collector region 7 and the $n^-$-type semiconductor region 1. The n-type impurity concentration in the n-type buffer region 8 is higher than the n-type impurity concentration in the $n^-$-type semiconductor region 1 and lower than the n-type impurity concentration in the $n^+$-type source region 6.

Operations of the semiconductor device 300 will now be described.

A voltage that is not less than a threshold is applied to the gate electrode 15 in a state in which a voltage that is positive with respect to the upper electrode 22 is applied to the lower electrode 21. Thereby, a channel (an inversion layer) is formed in the p-type semiconductor region 2; and the semiconductor device 200 is set to the ON-state. When electrons flow from the upper electrode 22 toward the $n^-$-type semiconductor region 1 via the channel, holes are injected from the $p^+$-type collector region 7 into the $n^-$-type semiconductor region 1. The electrical resistance of the semiconductor device 300 decreases greatly due to conductivity modulation occurring in the $n^-$-type semiconductor region 1. Subsequently, when the voltage applied to the gate electrode 15 becomes lower than the threshold, the channel in the p-type semiconductor region 2 disappears; and the semiconductor device 300 is set to the OFF-state.

The functions of the p$^+$-type ring-shaped region 10 and the semi-insulating layer 30 when the semiconductor device 300 is in the OFF-state are similar to those of the semiconductor devices 100 and 200. In the semiconductor device 300 as well, similarly to the first embodiment, the length in the diametrical direction of the p$^+$-type ring-shaped region 10 is shorter than the length in the diametrical direction of another p$^+$-type ring-shaped region 10 positioned further inward from the p$^+$-type ring-shaped region 10. Or, the distance between the p$^+$-type ring-shaped regions 10 is longer than the distance between other p$^+$-type ring-shaped regions 10 positioned further inward from the p$^+$-type ring-shaped regions 10. Or, the p-type impurity concentration in the p$^+$-type ring-shaped region 10 is lower than the p-type impurity concentration in another p$^+$-type ring-shaped region 10 positioned further inward from the p$^+$-type ring-shaped region 10. By satisfying at least one of these conditions, the injection of the holes into the semi-insulating layer 30 can be suppressed; and the decrease of the breakdown voltage as the voltage is applied to the semiconductor device 200 can be suppressed. In the semiconductor device 300, similarly to the third modification of the first embodiment, at least one of the lengths in the diametrical direction of the p$^+$-type ring-shaped regions 10 or the distances between the p$^+$-type ring-shaped regions 10 may be designed to satisfy the formulas described above.

The semiconductor devices illustrated in FIG. 9 and FIG. 10 have trench-gate structures in which the gate electrode 15 is provided inside the semiconductor layer SL. The semiconductor devices according to the second embodiment and the third embodiment may have planar-gate structures in which the gate electrode 15 is provided on the semiconductor layer SL. As long as the semiconductor devices according to the second embodiment and the third embodiment can operate respectively as a MOSFET and an IGBT, the specific structures of the p-type semiconductor region 2, the p$^+$-type contact region 5, the n$^+$-type source region 6, and the gate electrode 15 are modifiable as appropriate.

The embodiments may include the following configurations.

Configuration 1

A semiconductor device, comprising:
a first electrode;
a first semiconductor region provided on the first electrode and electrically connected to the first electrode, the first semiconductor region being of a first conductivity type;
a second semiconductor region provided on the first semiconductor region, the second semiconductor region being of a second conductivity type;
a third semiconductor region surrounding the second semiconductor region, being provided on the first semiconductor region, being of the first conductivity type, and having an impurity concentration of the first conductivity type higher than an impurity concentration of the first conductivity type in the first semiconductor region;
a plurality of ring-shaped regions surrounding the second semiconductor region, being separated from the second semiconductor region and the third semiconductor region, being provided to be separated from each other, being positioned between the second semiconductor region and the third semiconductor region, and being of the second conductivity type;

a second electrode provided on the second semiconductor region and electrically connected to the second semiconductor region;
a third electrode surrounding the second electrode, being provided to be separated from the second electrode on the third semiconductor region, and being electrically connected to the third semiconductor region; and
a semi-insulating layer contacting the first semiconductor region, the second electrode, the plurality of ring-shaped regions, and the third electrode,
the plurality of ring-shaped regions including first to nth ring-shaped regions arranged in a direction from the second semiconductor region toward the third semiconductor region,
a distance $\alpha_i$ (μm) between the ith ring-shaped region ($1 \le i \le n$) and the (i−1)th ring-shaped region next to each other in the direction (when i=1, the distance between the second semiconductor region and the first ring-shaped region), a length $\beta_i$ (μm) of the ith ring-shaped region in the direction, an elementary charge q (C), a dielectric constants ε (F/cm) of the first semiconductor region, a carrier density $N_d$ (cm$^{-2}$) of the first conductivity type in the first semiconductor region, a distance L (μm) between the second electrode and the third electrode in the direction, and a static breakdown voltage V (V) satisfy the following formulas.

$$\alpha_1 < \frac{2\varepsilon V}{LqN_d}$$

$$\alpha_i^2 < \frac{2\varepsilon V}{LqN_d}(\alpha_i + \beta_{i-1})$$

$$\sum_i \alpha_i^2 < \sum_i \frac{2\varepsilon V}{LqN_d}(\alpha_i + \beta_{i-1})$$

Configuration 2

The semiconductor device according to Configuration 1, wherein a resistivity of the semi-insulating layer is not less than 1.0×10$^8$ (Ω·cm) but less than 1.0×10$^{13}$ (Ω·cm).

Configuration 3

The semiconductor device according to Configuration 1, further comprising:
a fourth semiconductor region provided on the second semiconductor region, the fourth semiconductor region being of the first conductivity type; and
a gate electrode opposing the second semiconductor region with a gate insulating layer interposed.

Configuration 4

The semiconductor device according to Configuration 3, further comprising a fifth semiconductor region provided between the first electrode and the first semiconductor region, the fifth semiconductor region being of the second conductivity type.

In each of the embodiments described above, it is possible to confirm the relative levels of the impurity concentrations between the semiconductor regions by using, for example, a SCM (scanning capacitance microscope). The carrier concentration in each semiconductor region can be considered to be equal to the activated impurity concentration in each semiconductor region. Accordingly, the relative levels of the carrier concentrations between the semiconductor regions also can be confirmed using SCM. It is possible to measure the impurity concentration in each semiconductor region by, for example, SIMS (secondary ion mass spectrometry).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. The above embodiments can be practiced in combination with each other.

What is claimed is:

1. A semiconductor device, comprising:
a first electrode;
a first semiconductor region provided on the first electrode and electrically connected to the first electrode, the first semiconductor region being of a first conductivity type;
a second semiconductor region provided on the first semiconductor region, the second semiconductor region being of a second conductivity type;
a third semiconductor region surrounding the second semiconductor region, the third semiconductor region being provided on the first semiconductor region, the third semiconductor region being of the first conductivity type, an impurity concentration of the first conductivity type in the third semiconductor region being higher than an impurity concentration of the first conductivity type in the first semiconductor region;
a plurality of ring-shaped regions surrounding the second semiconductor region, the plurality of ring-shaped regions being separated from the second semiconductor region and the third semiconductor region, the plurality of ring-shaped regions being provided to be separated from each other, the plurality of ring-shaped regions being positioned between the second semiconductor region and the third semiconductor region, the plurality of ring-shaped regions being of the second conductivity type;
a second electrode provided on the second semiconductor region and electrically connected to the second semiconductor region;
a third electrode surrounding the second electrode, being provided to be separated from the second electrode on the third semiconductor region, the third electrode being electrically connected to the third semiconductor region; and
a semi-insulating layer contacting the first semiconductor region, the second electrode, the plurality of ring-shaped regions, and the third electrode,
the plurality of ring-shaped regions including a first ring-shaped region, and a second ring-shaped region provided between the first ring-shaped region and the third semiconductor region,
a length of the second ring-shaped region in a diametrical direction being shorter than a length of the first ring-shaped region in the diametrical direction, the diametrical direction being from the second semiconductor region toward the third semiconductor region.

2. The device according to claim 1, wherein
the plurality of ring-shaped regions further includes a third ring-shaped region provided between the second ring-shaped region and the third semiconductor region, and
a length of the third ring-shaped region in the diametrical direction is shorter than the length of the second ring-shaped region in the diametrical direction.

3. The device according to claim 1, wherein lengths in the diametrical direction of the plurality of ring-shaped regions are shorter toward an outer perimeter.

4. The device according to claim 1, wherein a resistivity of the semi-insulating layer is not less than $1.0 \times 10^8$ (Ω·cm) but less than $1.0 \times 10^{13}$ (Ω·cm).

5. The device according to claim 1, further comprising:
a fourth semiconductor region provided on the second semiconductor region, the fourth semiconductor region being of the first conductivity type; and
a gate electrode opposing the second semiconductor region with a gate insulating layer interposed.

6. The device according to claim 5, further comprising a fifth semiconductor region provided between the first electrode and the first semiconductor region, the fifth semiconductor region being of the second conductivity type.

7. A semiconductor device, comprising:
a first electrode;
a first semiconductor region provided on the first electrode and electrically connected to the first electrode, the first semiconductor region being of a first conductivity type;
a second semiconductor region provided on the first semiconductor region, the second semiconductor region being of a second conductivity type;
a third semiconductor region surrounding the second semiconductor region, the third semiconductor region being provided on the first semiconductor region, the third semiconductor region being of the first conductivity type, an impurity concentration of the first conductivity type in the third semiconductor region being higher than an impurity concentration of the first conductivity type in the first semiconductor region;
a plurality of ring-shaped regions surrounding the second semiconductor region, the plurality of ring-shaped regions being separated from the second semiconductor region and the third semiconductor region, the plurality of ring-shaped regions being provided to be separated from each other, the plurality of ring-shaped regions being positioned between the second semiconductor region and the third semiconductor region, the plurality of ring-shaped regions being of the second conductivity type;
a second electrode provided on the second semiconductor region and electrically connected to the second semiconductor region;
a third electrode surrounding the second electrode, being provided to be separated from the second electrode on the third semiconductor region, the third electrode being electrically connected to the third semiconductor region; and
a semi-insulating layer contacting the first semiconductor region, the second electrode, the plurality of ring-shaped regions, and the third electrode,
the plurality of ring-shaped regions including
a first ring-shaped region,
a second ring-shaped region next to the first ring-shaped region,
a third ring-shaped region provided between the second ring-shaped region and the third semiconductor region, and
a fourth ring-shaped region next to the third ring-shaped region,
a distance between the third ring-shaped region and the fourth ring-shaped region in a diametrical direction being longer than a distance between the first ring-shaped region and the second ring-shaped region in the diametrical direction, the diametrical direction being from the second semiconductor region toward the third semiconductor region.

8. The device according to claim 7, wherein the plurality of ring-shaped regions further includes:
   a fifth ring-shaped region provided between the fourth ring-shaped region and the third semiconductor region; and
   a sixth ring-shaped region next to the fifth ring-shaped region, and
   a distance between the fifth ring-shaped region and the sixth ring-shaped region in the diametrical direction is longer than the distance between the third ring-shaped region and the fourth ring-shaped region in the diametrical direction.

9. The device according to claim 7, wherein distances between the ring-shaped regions next to each other in the diametrical direction are longer toward an outer perimeter.

10. The device according to claim 7, wherein a resistivity of the semi-insulating layer is not less than $1.0 \times 10^8$ ($\Omega \cdot cm$) but less than $1.0 \times 10^{13}$ ($\Omega \cdot cm$).

11. The device according to claim 7, further comprising:
   a fourth semiconductor region provided on the second semiconductor region, the fourth semiconductor region being of the first conductivity type; and
   a gate electrode opposing the second semiconductor region with a gate insulating layer interposed.

12. The device according to claim 11, further comprising a fifth semiconductor region provided between the first electrode and the first semiconductor region, the fifth semiconductor region being of the second conductivity type.

13. A semiconductor device, comprising:
   a first electrode;
   a first semiconductor region provided on the first electrode and electrically connected to the first electrode, the first semiconductor region being of a first conductivity type;
   a second semiconductor region provided on the first semiconductor region, the second semiconductor region being of a second conductivity type;
   a third semiconductor region surrounding the second semiconductor region, the third semiconductor region being provided on the first semiconductor region, the third semiconductor region being of the first conductivity type, an impurity concentration of the first conductivity type in the third semiconductor region being higher than an impurity concentration of the first conductivity type in the first semiconductor region;
   a plurality of ring-shaped regions surrounding the second semiconductor region, the plurality of ring-shaped regions being separated from the second semiconductor region and the third semiconductor region, the plurality of ring-shaped regions being provided to be separated from each other, the plurality of ring-shaped regions being positioned between the second semiconductor region and the third semiconductor region, the plurality of ring-shaped regions being of the second conductivity type;
   a second electrode provided on the second semiconductor region and electrically connected to the second semiconductor region;
   a third electrode surrounding the second electrode, being provided to be separated from the second electrode on the third semiconductor region, the third electrode being electrically connected to the third semiconductor region; and
   a semi-insulating layer contacting the first semiconductor region, the second electrode, the plurality of ring-shaped regions, and the third electrode,
   the plurality of ring-shaped regions including a first ring-shaped region, and a second ring-shaped region provided between the first ring-shaped region and the third semiconductor region,
   an impurity concentration of the second conductivity type in the second ring-shaped region being lower than an impurity concentration of the second conductivity type in the first ring-shaped region.

14. The device according to claim 13, wherein
   the plurality of ring-shaped regions further includes a third ring-shaped region provided between the second ring-shaped region and the third semiconductor region, and
   an impurity concentration of the second conductivity type in the third ring-shaped region is lower than the impurity concentration of the second conductivity type in the second ring-shaped region.

15. The device according to claim 13, wherein impurity concentrations of the second conductivity type in the plurality of ring-shaped regions are lower toward an outer perimeter.

16. The device according to claim 13, wherein a resistivity of the semi-insulating layer is not less than $1.0 \times 10^8$ ($\Omega \cdot cm$) but less than $1.0 \times 10^{13}$ ($\Omega \cdot cm$).

17. The device according to claim 13, further comprising:
   a fourth semiconductor region provided on the second semiconductor region, the fourth semiconductor region being of the first conductivity type; and
   a gate electrode opposing the second semiconductor region with a gate insulating layer interposed.

18. The device according to claim 17, further comprising a fifth semiconductor region provided between the first electrode and the first semiconductor region, the fifth semiconductor region being of the second conductivity type.

* * * * *